United States Patent [19]

Yates

[11] Patent Number: 4,609,565

[45] Date of Patent: Sep. 2, 1986

[54] METHOD OF FABRICATING SOLAR CELLS

[75] Inventor: Douglas A. Yates, Burlington, Mass.

[73] Assignee: Mobil Solar Energy Corporation, Waltham, Mass.

[21] Appl. No.: 681,003

[22] Filed: Dec. 13, 1984

Related U.S. Application Data

[63] Continuation-in-part of Ser. No. 659,279, Oct. 10, 1984, abandoned, which is a continuation of Ser. No. 563,061, Dec. 19, 1983, abandoned.

[51] Int. Cl.[4] .......................... B05D 3/06; B05D 5/12
[52] U.S. Cl. .................................... 427/38; 427/43.1; 427/89; 427/90; 427/96; 427/162; 427/264; 427/269; 427/270; 427/272; 427/282; 427/287; 427/304; 427/305; 427/307; 427/383.3; 427/404; 148/1.5
[58] Field of Search ...................... 427/162, 38, 89, 90, 427/287, 43.1, 282, 383.3, 307, 404, 96, 269, 272, 304–306, 264, 270; 148/1.5

[56] References Cited

U.S. PATENT DOCUMENTS

| 4,004,044 | 1/1977 | Franco | 427/43.1 |
|---|---|---|---|
| 4,214,966 | 7/1980 | Mahoney | 427/38 |
| 4,224,084 | 9/1980 | Pankare | 148/1.5 |
| 4,261,762 | 4/1981 | King | 427/38 |
| 4,289,381 | 9/1981 | Garvin et al. | 427/43.1 |
| 4,314,874 | 2/1982 | Abe et al. | 427/43.1 |
| 4,436,761 | 3/1984 | Hayashi et al. | 427/38 |

Primary Examiner—Norman Morgenstern
Assistant Examiner—Janyce A. Bell
Attorney, Agent, or Firm—Schiller & Pandiscio

[57] ABSTRACT

A solar cell fabrication procedure is described which is characterized by (1) removal of the front surface electrode plating mask after preliminary metallization of the front surface electrodes, (2) a passivation step which, inter alia, results in the formation of an altered silicon substrate surface layer, and (3) use of the altered surface layer as a plating mask for subsequent metallization steps involving, for example, immersion plating of nickel and immersion plating or electroplating of copper.

20 Claims, 1 Drawing Figure

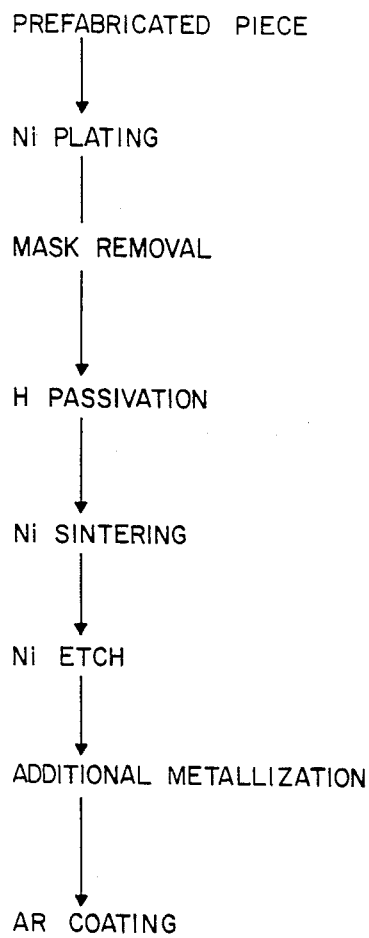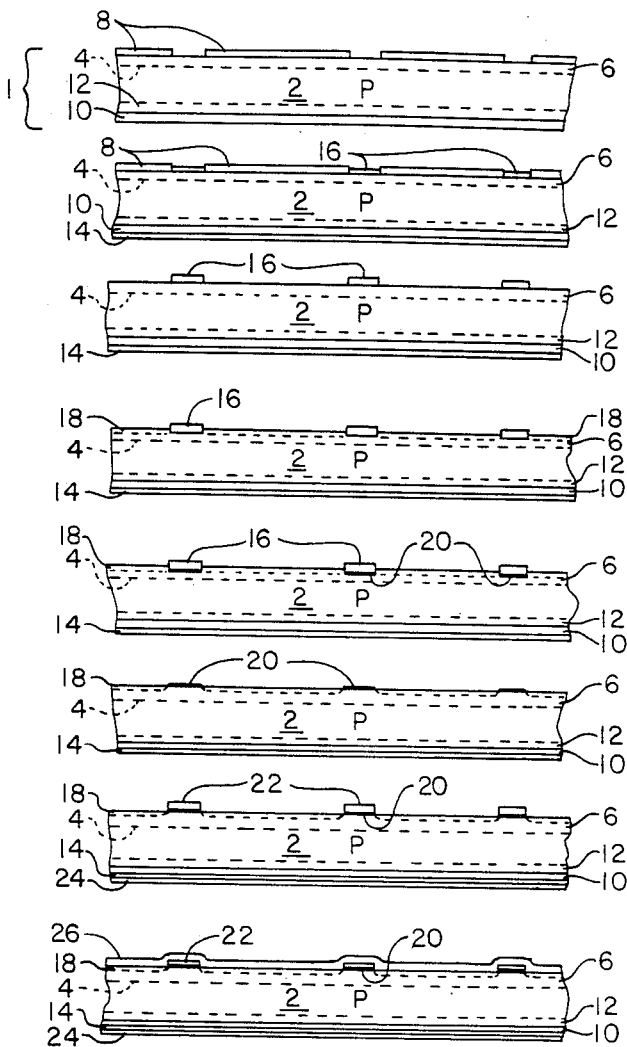

METHOD OF FABRICATING SOLAR CELLS

BACKGROUND OF THE INVENTION

This application is a continuation-in-part of application Ser. No. 659,279, filed Oct. 10, 1984, now abandoned, which is a continuation of application Ser. No. 563,061, filed Dec. 19, 1983, now abandoned.

This invention pertains to the manufacture of photovoltaic cells and more particularly to an improved low-cost method of fabricating polycrystalline silicon solar cells wherein the damaged surface layer generated during hydrogen passivation is used as a plating mask for the final plating steps.

Heretofore a common method of fabricating silicon solar cells has included the steps of forming a PN junction by diffusing a suitable dopant into the front side of a silicon wafer or ribbon, etching a grid electrode pattern in a protective dielectric masking layer formed on that front surface, depositing a nickel plating on all silicon exposed by the etching, overplating the nickel with copper and tin, removing the remainder of the dielectric masking layer from the front surface, and providing an anti-reflection coating on the newly exposed portions of the front surface.

While these fabrication steps may be equally applied to both single crystal and polycrystalline silicon, cost considerations make it desirable to fabricate solar cells from the latter. However, as is well known, because of the minority carrier losses at grain boundaries, dislocations, and the like, the efficiencies achieved with polycrystalline silicon solar cells are generally poorer than those of monocrystalline cells. This circumstance has been improved upon by introducing a monovalent element, such as hydrogen, into the structure so as to combine with the dangling bonds associated with the structural defects, thereby minimizing the minority carrier recombination loss.

As is known in the art, an important consideration in designing a cell processing sequence is that the combination of time and temperature in any step following the hydrogen passivation step should not cause the hydrogen introduced into the silicon to be diffused back out of the passivated substrate. Thus, for instance, it has been found that a hydrogen passivated cell subjected to a temperature of 600° C. for one-half hour in a vacuum loses substantially all the bonded hydrogen and returns to its pre-passivation level, as evidenced by its observed electron beam induced current activity. It should be noted in this regard that the junction diffusion step in solar cell fabrication typically involves temperatures on the order of 900° C.

It has also been found that hydrogen passivation normally heats the cell to a high enough temperature to cause base metals, such as copper, to migrate through the junction, thereby causing a "soft" diode or a short circuit. As shown, for instance, by C. H. Seager, D. J. Sharp, J. K. G. Panitz, and R. V. D'Aiello in *Journal of Vacuum Science and Technology*, Vol. 20, no. 3, pp 430–435 (March 1982), passivation of polycrystalline silicon may be accomplished with a Kaufman-type ion source used to produce a hydrogen ion beam in the kilo electron volt energy range. Relatively short exposure times (e.g. between 0.5 and 4 minutes) in a high ion energy and flux (e.g. 1 to 3 milliamperes per square centimeter) range appear to be optimal. Such exposures generally result in the substrate temperature rising to at least approximately 275° C., if the substrate is carefully contacted to an appropriate heat sink. Otherwise, temperatures in excess of 400° C. are readily achieved. It is important, however, that temperatures be limited to less than about 300° C. to avoid rapid migration of base metals into the silicon matrix. However, manipulation of substrate and heat sink to effect thermal control during passivation easily becomes the rate limiting factor in high throughput processing with such ion sources. Consequently, it is desirable to avoid heat sinking in order to obtain a low cost, high throughput process. Additionally, for EFG-type silicon ribbon, which may be economically produced, surface irregularities make heat sinking difficult.

Additionally, hydrogen passivation is most effective when the base silicon surface is exposed. Thus, any plating mask used to define the front surface grid electrode pattern should be removed prior to or added after passivation.

OBJECTS OF THE INVENTION

Accordingly, it is an object of the present invention to provide a processing sequence for the fabrication of solar cells in which a hydrogen passivation step is incorporated after the high temperature processing steps yet before any base metals are incorporated in the structure.

It is a further object of the present invention to incorporate the hydrogen passivation step so as to improve the passivation of the silicon and nickel silicide underlying the front electrode structure of a partially fabricated cell.

It is yet another object of the present invention to incorporate a hydrogen passivation step into the processing of EFG-type silicon ribbon into solar cells in such a way as to avoid the necessity of heat sinking the substrate during passivation.

BRIEF DESCRIPTION OF THE INVENTION

These and other objects are realized by a process which, in a preferred embodiment as applied to the manufacture of silicon solar cells involves, inter alia, the following steps: (1) forming a thin grid electrode pattern of nickel (or similar material) on the front surface of a shallow-junction silicon ribbon, (2) hydrogen passivating the junction side of the cell, (3) sintering the nickel to form in part a nickel silicide, (4) plating additional metal(s) onto the metal-covered portions of the cell, and (5) antireflection coating the exposed surface of the silicon. Thereafter, the silicon may be further processed, e.g. to prepare it for connection to electrical circuits.

In an alternative process, the heating of the sample during passivation supplies energy for the nickel sintering step.

These fabrication sequences have several key characteristics. Firstly, applicant has discovered that during hydrogen passivation the impinging hydrogen ions alter the surface of the silicon wafer in such a way as to impede the plating of metals by immersion plating onto the altered surface. As a consequence, any plating mask initially used to define the front surface electrode grid pattern can be removed after an initial layer of metal has been plated onto the substrate. Passivation may now be accomplished upon an exposed base silicon layer, the passivation not only improving the electrical performance of the cell but also, in altering the surface layer, serving as a secondary plating mask for subsequent immersion plating steps. As a result, passivation of the exposed silicon base may be accomplished prior to the application of base metals without the requirement of an additional masking step prior to immersion plating metallization. Further, applicant has also found that passivation can occur through thin layers of metals such as nickel. Thus, the silicon and nickel silicide under the initial thin nickel plating of a front electrode may be passivated.

Other objects of the invention will in part be obvious and will in part appear hereinafter. The invention accordingly comprises the several steps and the relation of one or more of such steps with respect to each of the others which are exemplified in the following detailed disclosure, and the scope of the application of which will be indicated in the claims.

BRIEF DESCRIPTION OF THE DRAWING

For a fuller understanding of the nature and objects of the present invention, reference should be had to the following detailed description which is to be considered together with the accompanying drawing which illustrates a number of the steps involved in making solar cells according to a preferred form of the invention.

Throughout the drawing, like reference numbers refer to similar structure.

In the drawing, the thicknesses and depths of the several coatings and regions are not shown to scale nor exactly in accordance with their relative proportions, for convenience of illustration.

DETAILED DESCRIPTION OF THE INVENTION

Referring now to the drawing, the preferred embodiment of the invention relates to the production of solar cells from EFG grown P-type silicon ribbon. For this embodiment, there is provided as a starting piece a partially finished cell 1. Partially finished cell 1 has a substrate 2, preferably formed from a P-type conductivity silicon ribbon, one side (hereafter the "front side") of which has been provided with a relatively shallow junction 4 (i.e., a junction of between about 3,000 and about 7,000 Angstrom units deep), an N-type conductivity region 6, and a mask 8. Mask 8 is of a material (e.g., a dielectric) to which metals, such as nickel, will only poorly adhere, and is configured to expose portions of the front surface of substrate 2 in a pattern of a multi-fingered grid electrode (e.g., an electrode having the form illustrated in U.S. Pat. No. 3,686,036). The other side (hereafter the "rear side") of the substrate is preferably provided with a layer 10 of aluminum alloyed to the substrate and a P+ region 12. The P+ region 12 preferably has a depth of from about 1 to about 5 microns.

Partially finished cell 1 may be fabricated by any of a number of means well known in the art. For instance, junction 4 and region 6 may be formed in a P-type silicon substrate 2 by the diffusion of phosphorus, and mask 8 may be formed on the front surface thereof by photolithography or printing. Layer 10 and P+ region 12 may be formed by coating the rear side of the substrate with a layer of an aluminum past comprising aluminum powder in a volatile organic vehicle, such as terpineol, that can be removed by evaporation, and then heating the substrate to remove any volatile or pyrolyzable organic components of the paste and to alloy the aluminum to the substrate and form the P+ region. However, other forms of substrate, junction, and rear electrode, and other methods of fabrication, may equally well be employed to provide partially finished cell 1.

Starting with such a prefabricated piece, both sides of the substrate are first plated with nickel, an adhesive deposition of nickel forming a nickel layer 14 on the back side of the piece over the entire area of aluminum layer 10, while the adhesive deposition of nickel on the front side forms a layer 16 directly on the surface of substrate 2 only on those areas exposed through mask 8.

Plating of the nickel layers 14 and 16 may be done in various ways. Preferably it is accomplished in accordance with a known electroless or immersion plating process, e.g., an immersion plating process like or similar to the one described in U.S. Pat. No. 4,321,283 of Kirit Patel, et al. As used herein, the term "electroless plating" designates plating from a bath that contains a reducing agent without the use of an externally applied electric field, and the term "immersion plating" means a process wherein an object is plated with a metal without the use of an externally applied electric field by immersing it in a plating bath that does not contain a reducing agent, and the plating involves a displacement reaction.

As a preliminary step, the cleaned silicon substrate surface is pre-activated with a suitable agent. This pre-activation procedure is desirable since often the silicon surface will not itself support the electroless plating process, and any nickel plated on an untreated surface generally adheres thereto only poorly. Preferably, gold chloride is used as the activating agent, although platinum chloride, stannous chloride-palladium chlroide, or other well known activators may be used, as described, for instance, in U.S. Pat. No. 3,489,603. Thereafter, both sides of the silicon ribbon are coated with a layer of nickel, preferably by immersion plating the ribbon in an aqueous bath as described in said U.S. Pat. No. 4,321,283, or an aqueous bath of nickel sulfamate and ammonium fluoride at a pH of about 2.9 and at approximately room temperature for a period of about 2 to 6 minutes.

At this stage, mask 8 is stripped from substrate 2. Depending on the nature of the mask, this may be accomplished in any of a number of well-known ways, as, for instance, by the use of a buffered etch. As a result of the mask removal, the front surface of substrate 2 is exposed through a grid pattern formed of nickel layer 16.

Next, the cell is hydrogen passivated. A preferred method is to expose the front surface of substrate 2 (and nickel layer 16) to the hydrogen ion beam of a Kaufman-type (broad beam) ion source situated about 15 cm from the substrate. This ion source is preferably operated at a pressure of between about 20 and 50 millitorr (of hydrogen), with a hydrogen flow rate on the order of about 25 to 40 s.c.c. per minute, with a potential of about 1700 volts d.c. between source and substrate, and with a beam current of between about 1 and 3 milliampere/cm$^2$ at the substrate. An exposure time of between about 1 and about 4 minutes has been found adequate both to minimize the minority carrier recombination losses typically experienced with EFG-type silicon cells (providing a passivation zone some 20 to 80 microns deep, or about 100 times as deep as junction 4) while simultaneously providing an altered surface layer 18 approximately 200 Angstrom units deep on the exposed portions of substrate 2. It has also been found that using a mechanical shutter to pulse the ion beam on and off with about a 50% duty cycle results in a minimal temperature rise of the substrate during passivation.

The exact nature of altered surface layer 18 is not known. However, it is believed to be a damaged zone wherein the crystal structure has been somewhat disrupted, the silicon in part forming SiH or $SiH_2$ with hydrogen from the ion beam, yet wherein the material is possibly amorphous. A small amount of carbon or one or more hydrocarbons within the vacuum system may be necessary for the formation of the desired altered surface layer. As initially installed, the Kaufman ion source used was equipped with a graphite mounting stage about 5 inches (c. 13 cm) in diameter on which the substrates, typically 2 by 4 inches (5 by 10 cm) on a side, were centrally located. In some cases, when a silicon mounting stage was substituted for the graphite stage, the altered layer formed did not perform as a plating mask as well as when the graphite stage was employed. On the basis of this, it has been hypothesized that carbon or hydrocarbon vapor formed by the impact of the hydrogen ion beam on the graphite stage may enhance the formation of a dielectric layer on the surface of the substrate. Whatever its nature, it has been found that an altered surface layer 18 produced in accordance with this procedure with accelerating voltages between about 1400 and about 1700 volts and exposure times as short as 1 minute is sufficient to prevent subsequent immersion plating of the silicon substrate between nickel layers 16.

Next, the substrate is heated in an inert or a nitrogen atmosphere to a temperature and for a time sufficient to sinter the nickel layers and cause the nickel layer 16 on the front side of the substrate to react with the adjacent silicon to form a nickel silicide ohmic contact. For this purpose, the substrate is preferably heated to a temperature of about 300° C. for between about 15 and about 40 minutes. This provides a nickel silicide layer 20 with a depth of about 300 Angstrom units at the interface between nickel layer 16 and substrate 2. The nickel layer 14 on the rear side forms an alloy with aluminum layer 10. The temperature of this sintering step should not greatly exceed 300° C., as higher temperatures lead to excessive penetration of nickel layer 16 into the silicon. This heat treatment, if carried out in forming gas (95% nitrogen and 5% hydrogen) also appears to drive off hydrogen loosely bound to nickel layer 16, thereby enhancing subsequent plating adherence.

Following this, the nickel of layers 14 and 16 is subjected to etching with hot dilute nitric acid, followed by ultrasonic cleaning, to remove excess nickel from both sides of the substrate. The nickel etch not only removes excess nickel but also removes some of the nickel - aluminum alloy formed on the rear side of the substrate during the sintering step. After the nickel etch step, layer 14 is characterized by an nickel - aluminum alloy layer overlying aluminum electrode layer 10 while layer 16 is stripped to expose nickel silicide layer 20 corresponding to the preselected electrode grid pattern.

Thereafter nickel silicide layer 20 and the nickel - aluminum alloy layer 14 are respectively further metallized with one or more layers 22 and 24 to provide suitable contacts. In these metallization steps, altered surface layer 18 of substrate 2 acts as a plating mask to prevent metal from adhering to the surface of the substrate between the pattern of the already attached nickel silicide layer 20. Preferably but not necessarily, this additional metallization involves application of a second layer of nickel to layers 14 and 20. The additional nickel layers are applied by immersion plating in the manner described above in connection with formation of nickel layers 14 and 16, since with immersion plating nickel will plate onto the layers 14 and 16 but not onto the altered surface 18. Immediately thereafter, one or more layers of copper are applied (by immersion plating and/or electroplating, by techniques well known in the art) to the exposed nickel on both sides of the substrate so as to bond to the nickel layers and thereby protect them against oxidation and to insure a high conductivity. No masking of the altered layer 18 is required for the copper plating since the copper will not adhere to the altered layer. Thereafter the device may be subjected to other treatments for known purposes, e.g., layers of tin and solder may be applied successively over the previously applied metal layers.

Following metallization, the cell edges (not shown) are trimmed, and an anti-reflection coating 26, is applied to the front surface of the cell. This latter step may be accomplished by any of a number of known methods, such as by chemical vapor deposition or of, for instance, $TiO_2$. Alternatively, antireflection coating 26 may be formed by the plasma deposition of silicon nitride.

By way of example, the preferred method of practicing the present invention comprises performing the individual steps set forth hereinabove in the preferred mode described in detail for each step and in the sequence set forth.

It will be understood that the preferred method of the present invention comprises performing the individual preferred steps detailed supra, these steps being performed in the sequence just indicated.

It has been determined that solar cells made according to the foregoing process from EFG grown ribbons show between a 10 and 20% increase in average efficiency. In addition, for this material the hydrogen passivation step has also been found to markedly narrow the distribution of cell efficiencies.

The process described above has a number of other advantages. Firstly, in utilizing the substrate's altered surface layer generated during hydrogen passivation as a mask for subsequent plating by an immersion plating method, e.g., nickel plating as above-described, the method permits passivation of an exposed substrate prior to such later metallization. This allows passivation of a clean substrate (rather than passivation through a plating mask layer), avoids "soft" or shorted cells (resulting from base metal migration during passivation), and economizes the steps between passivation and subsequent metallization by immersion plating, as no further masking step is required. It is to be noted that the hydrogen passivated area also serves as a mask to reject deposition of copper by immersion plating or electroplating. Additionally, by passivating through a thin layer of front electrode material, the substrate beneath the front electrodes may be passivated as well, provided the initial nickel layer is no more than about 750 Angstrom units thick. It will be appreciated also that the process of the present invention incorporates the passivation at a stage of cell fabrication where subsequent treatment of the cell will not adversely affect the effects of passivation.

It will be understood that a number of modifications may be made to the process without departing from the scope of the invention herein descibed. Thus, while in the preferred embodiment the nickel sintering step is performed following passivation, it might also be performed just prior to passivation. In such a case, it will be appreciated that, for shallow junction cells, short ion beam exposures with or without thermal control of the substrate by an appropriate heat sink may be desireable to insure against migration of the nickel silicide to the junction. Such control also produces $Ni_2Si$, rather than the other silicides ($NiSi$ or $NiSi_2$), thereby incorporating less silicon per molecule of the silicide and insuring against complete penetration of the $N^+$ region by the silicide. It will also be understood that if nickel sintering is performed prior to passivation, a baking step following passivation may be required to drive the losely bound hydrogen out of the nickel prior to further processing.

It is also obvious that the heating of the cell during passivation can be used to perform at least part of the nickel sintering step.

Then too, while the preferred embodiment of the method of the present invention makes use of the altered layer formed by hydrogen passivation to mask subsequent immersion nickel plating except on earlier plated nickel, the method may be used with other metals than nickel. For instance, as will be understood by those skilled in the art, the initial layer of the front surface electrodes on a shallow junction silicon device may be deposited by plating, in various ways known to persons skilled in the art, any of a number of low reactivity materials capable of forming (preferably at a low temperature) an ohmic contact and serving as a barrier to the diffusion of copper or any other base metal deposited at a later stage. Suitable metals for use with copper include palladium, platinum, cobalt, and rhodium, as well as nickel. While all of these materials form silicides, a silicide layer is not essential. It is important, however, that the initial metal layer adhere properly, serve as an ohmic contact, and act as a barrier to the migration of any metal deposited later, as well as not significantly migrating to the junction itself.

Of course, the process provided by this invention is not limited to the production of solar cells from EFG substrates. Thus, for example, cast polycrystal line substrates, epitaxial silicon on metallurgical grade silicon or fine grade polysilicon layers formed by chemical or physical vapor deposition can be used to form relatively high efficiency solar cells according to the present invention. Further, the process is applicable to single crystal silicon. Then, too, the process may be practiced with N-type as well as P-type material.

Since these and other changes may be made in the above processes without departing from the scope of the invention herein involved, it is intended that all matter contained in the above description or shown in the accompanying drawing shall be interepreted in an illustrative and not a limiting sense.

What is claimed is:

1. A method of fabricating solid state semiconductor devices comprising in sequence the steps of:
    (a) providing a silicon substrate having opposing first and second surfaces;
    (b) exposing selected regions of said first surface to a hydrogen ion beam of an intensity and for a duration sufficient to form a surface layer on said first surface to which selected metals will only poorly adhere; and
    (c) metallizing said first surface exclusive of said selected regions with at least one of said selected metals.

2. The method according to claim 1 and further including the step of forming a junction in said substrate adjacent said first surface.

3. The method according to claim 1 wherein said devices are photovoltaic and further including the step of applying an anti-reflection coating to said first surface.

4. Method according to claim 1 wherein said metallization is performed using a metal chosen from the group of metals including nickel, palladium, cobalt, platinum, and rhodium.

5. A method of fabricating solid state semiconductor devices comprising in sequence the steps of:
    (a) providing (1) a silicon substrate having opposing first and second surfaces and having a junction adjacent said first surface and (2) a plating mask exposing first selected portions of said first surface and covering second selected portions of said first surface;
    (b) applying a coating of aluminum to said second surface;
    (c) heating said silicon substrate to a temperature and for a time sufficient to cause the aluminum of said coating of aluminum to alloy with said silicon substrate;
    (d) applying a nickel coating to said first selected portions of said first surface;
    (e) removing said plating mask;
    (f) exposing said second selected portions of said first surface to a hydrogen ion beam of an intensity and for a duration sufficient to form a surface layer on said second selected portions of said first surface to which selected conductive metals will only poorly adhere;
    (g) sintering said nickel coating so that the nickel and silicon at said first selected portions react to form nickel silicide at their interface; and
    (h) coating said nickel and aluminum coatings with at least one layer of at least one of said conductive metals.

6. The method according to claim 5 wherein said at least one layer is applied by (a) contacting said nickel coating with an etchant to remove unbonded nickel, and (b) overcoating said nickel coating with copper.

7. The method according to claim 5 and firther including the step of applying an anti-reflection coating to said first surface.

8. The method according to claim 5 wherein additionally the exposure of said substrate to said hydrogen ion beam is of sufficient time and intensity to decrease the minority carrier losses of said substrate.

9. A method of fabricating solid state semiconductor devices comprising in sequence the steps of:
    (a) providing (1) a silicon substrate having opposing first and second surfaces and having a junction adjacent said first surface and (2) a plating mask exposing first selected portions of said first surface and covering second selected portions of said first surface;
    (b) applying a nickel coating to said first selected portions of said first surface;
    (c) removing said plating mask;
    (d) exposing said second selected portions of said first surface to a hydrogen ion beam of an intensity and for a duration sufficient to form a surface layer on said second selected portions of said first surface to which selected conductive metals will only poorly adhere;
    (e) sintering said nickel coating so that the nickel and silicon at said first selected portions react to form nickel silicide at their interface; and (f) coating said nickel coating with at least one additional conductive metal layer.

10. A method according to claim 9 wherein said at least one additional conductive metal layer comprises a nickel layer that is formed by an immersion plating process.

11. A method according to claim 10 wherein said plating process utilizes a bath comprising a nickel salt and fluoride ions.

12. A method according to claim 7 wherein said at least one additional conductive metal layer comprises a layer of copper formed by immersion plating or electroplating.

13. Method according to claim 1 wherein the metallization of said first surface comprises formation of a layer of nickel by an immersion plating process.

14. Method according to claim 5 wherein step (d) comprises formation of a nickel coating by an immersion plating process.

15. Method according to claim 5 wherein said plating mask is a dielectric.

16. Method according to claim 9 wherein step (f) comprises formation of a nickel coating by an immersion plating process.

17. A method of fabricating solid state semiconductor devices comprising in sequence the steps of:
(a) providing (1) a silicon substrate having opposing first and second surfaces and a junction adjacent said first surface, and (2) a plating mask exposing first selected portions of said first surface and covering second selected portions of said first surface.
(b) applying a coating of aluminum to said second surface;
(c) heating said silicon substrate to a temperature and for a time sufficient to cause the aluminum of said coating of aluminum to alloy with said silicon substrate;
(d) applying a nickel coating to said first selected portions of said first surface;
(e) sintering said nickel coating so that the nickel and silicon at said first selected portions react to form nickel silicide at there interface;
(f) removing said plating mask so as to expose said second selected portions of said first surface;
(g) exposing said second selected portions of said first surface to a hydrogen ion beam of an intensity and for a duration sufficient to form a surface layer on said second selected portions of said first surface to which selected conductive metals will only poorly adhere; and
(h) coating said nickel and aluminum coatings with at least one layer of at least one of said selected conductive metals.

18. The method according to claim 17 wherein said nickel and aluminum coatings are coated with a layer of nickel.

19. The method according to claim 17 wherein said nickel and aluminum coatings are coated with layers of nickel and copper.

20. The method according to claim 17 wherein said nickel and aluminum coatings are coated with at least one layer of nickel by an immersion plating process.

* * * * *